(12) United States Patent
Friedrichs et al.

(10) Patent No.: US 6,822,842 B2
(45) Date of Patent: Nov. 23, 2004

(54) SWITCHING DEVICE FOR SWITCHING AT A HIGH OPERATING VOLTAGE

(75) Inventors: Peter Friedrichs, Nürnberg (DE); Heinz Mitlehner, Uttenreuth (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 45 days.

(21) Appl. No.: 10/395,427

(22) Filed: Mar. 24, 2003

(65) Prior Publication Data

US 2003/0168919 A1 Sep. 11, 2003

Related U.S. Application Data

(63) Continuation of application No. PCT/DE02/00307, filed on Jan. 29, 2002.

(30) Foreign Application Priority Data

Jul. 23, 2001 (DE) .......................................... 101 35 835

(51) Int. Cl.⁷ ............................................... H02H 3/22
(52) U.S. Cl. ........................ 361/111; 327/309; 327/327
(58) Field of Search .................. 361/111, 56; 327/309, 327/327, 328

(56) References Cited

U.S. PATENT DOCUMENTS

| | | |
|---|---|---|
| 4,663,547 A | 5/1987 | Baliga et al. |
| 5,406,096 A | 4/1995 | Malhi |
| 6,034,385 A | 3/2000 | Stephani et al. |
| 6,157,049 A | 12/2000 | Mitlehner et al. |
| 6,617,906 B1 * | 9/2003 | Hastings ..................... 327/321 |
| 6,653,666 B2 * | 11/2003 | Mitlehner et al. .......... 257/134 |
| 2002/0020849 A1 | 2/2002 | Mitlehner et al. |

FOREIGN PATENT DOCUMENTS

| | | |
|---|---|---|
| DE | 198 33 214 C1 | 8/1999 |
| DE | 199 26 109 A1 | 12/2000 |
| EP | 0 063 749 B1 | 11/1982 |
| JP | 55121682 | 9/1980 |
| JP | 61285770 | 12/1986 |

* cited by examiner

Primary Examiner—Gregory J. Toatley, Jr.
Assistant Examiner—Boris Benenson
(74) Attorney, Agent, or Firm—Laurence A. Greenberg; Werner H. Stemer; Ralph E. Locher

(57) ABSTRACT

A switching device for switching at a high operating voltage includes an LV switching element and a first HV switching element that are connected together in a cascode circuit. Furthermore, at least a second HV switching element is connected in series with the first HV switching element. A first protection element is connected between the HV grid terminals of the first and second HV switching elements, respectively.

20 Claims, 3 Drawing Sheets

SWITCHING DEVICE FOR SWITCHING AT A HIGH OPERATING VOLTAGE

CROSS-REFERENCE TO RELATED APPLICATION

This application is a continuation of copending International Application No. PCT/DE02/00307, filed Jan. 29, 2002, which designated the United States and was not published in English.

BACKGROUND OF THE INVENTION

Field of the Invention

The invention relates to a switching device for switching at a high operating voltage and includes at least a low-voltage (LV) switching element having an LV cathode terminal, an LV anode terminal, and an LV grid terminal, a first high-voltage (HV) switching element having a first HV cathode terminal, a first HV anode terminal, and a first HV grid terminal, the LV anode terminal being electrically short-circuited with the first HV cathode terminal and the LV cathode terminal being electrically short-circuited with the first HV grid terminal.

A switching device is disclosed in U.S. Pat. No. 6,157,049 to Mitlehner et al. and also in European Patent Application 0 063 749 B1, corresponding to U.S. Pat. No. 4,663,547 to Baliga et al. The electronic switching device respectively disclosed is based on the special interconnection of the LV and HV switching elements mentioned. It is also referred to as a cascode circuit. The switching device serves for switching a high electric current and is also able to reliably block a high operating voltage. The LV switching element, a normally off MOSFET, includes silicon (Si) and ensures that the interconnection with the HV switching element, configured as a normally on JFET, produces a normally off unit. The HV switching element includes a semiconductor material with a breakdown field strength of more than $10^6$ V/cm. In the blocking situation, the HV switching element, then, takes up the substantial part of the voltage to be blocked that is present at the cascode circuit. The semiconductor material silicon carbide (SiC) is particularly suitable as a starting material for the HV switching element.

In converter technology, which is also used, for example, in a variable-speed drive, a switching device is required that achieves a high efficiency as near to 100% as possible at a high power, i.e., generally also at a high operating voltage. If the switching device has the lowest possible static and dynamic losses, a virtually optimal utilization of energy is achieved and, accompanying this, a significant reduction in the required cooling outlay is achieved.

At the present time, converter technology usually employs, as HV switching element, a silicon Insulated Gate Bipolar Transistor (IGBT) or a silicon Gate Turn Off (GTO) thyristor in the voltage range up to 6.5 kV and a silicon thyristor in a voltage range up to about 10 kV. However, these switching elements are bipolar semiconductor components whose structure dictates that they have both a certain delay time and appreciable dynamic switching losses during switching on account of an unavoidable stored charge effect.

This problem is avoided by a cascode circuit constructed only with unipolar switching elements, that is to say, with field-effect transistors, for example. In addition to the static loss being low in any case, a unipolar switching element is also distinguished by a short switching time and by low dynamic losses on account of the lack of stored charge effects. In the case of an HV switching element configured as a junction field-effect transistor realized in SiC, the maximum permissible reverse voltage can be achieved in two different ways. First, the drift zone is lengthened. In the case of a vertical junction field-effect transistor, this is equivalent to growing a thicker epitaxial layer on the substrate used. Second, the dopant concentration within the epitaxial layer is also reduced. Both measures, which are favorable with regard to the maximum permissible reverse voltage, bring about an increase in the nonreactive drift resistance, however. In the on state (switching element closed), this leads to a higher static power loss that is dissipated thermally. Therefore, a cascode circuit that is realized using a unipolar HV switching element made of SiC is restricted at the present time to a maximum permissible reverse voltage of the order of magnitude of typically 3.5 kV. In principle, however, an even higher reverse voltage, for example, of 5 kV, is also possible.

If a switching device is required for a higher reverse voltage, at the present time this is possible only by a plurality of series-connected cascode elements, which are constructed with unipolar switching elements in the manner described, or by a series circuit including a plurality of unipolar switching elements or by the use of the bipolar silicon switching elements described. As already described, a bipolar switching element leads to a longer switching time and to higher dynamic losses.

In the case of the series circuit including a plurality of cascode circuits, a dedicated drive is required for the LV switching element of each cascode circuit. An added difficulty is that these active drives are also at a different electrical potential. This results in a not inconsiderable outlay on circuitry, which also leads to higher costs.

Furthermore, German Published, Non-Prosecuted Patent Application DE 199 26 109 A1 discloses a switching device for a higher reverse voltage based on a modified cascode circuit. In such a case, the cascode circuit is altered by an additional switching element in the form of an auxiliary transistor being inserted into the short-circuit connection originally provided between the LV cathode terminal and the first HV grid terminal. As a result, the LV switching element is intended to take up a higher reverse voltage before the HV switching element is also switched over to its blocking state so that an overall increased reverse voltage can be taken up by the modified cascode circuit. A development of such a modified cascode circuit lies' in connecting further HV switching elements in series with the first HV switching element of the modified cascode circuit. A further auxiliary transistor is in each case provided between the control terminals of the further switching elements. In addition, protection elements in the form of zener diodes may be provided for safeguarding purposes, in particular, for the purpose of limiting the potentials at the control terminals. Such a switching device is also associated with a not inconsiderable outlay on circuitry precisely on account of the auxiliary transistors characterized as essential to the invention disclosed in German Published, Non-Prosecuted Patent Application DE 199 26 109 A1.

SUMMARY OF THE INVENTION

It is accordingly an object of the invention to provide a switching device for switching at a high operating voltage that overcomes the hereinafore-mentioned disadvantages of the heretofore-known devices of this general type and that has a high reverse voltage and, at the same time, can be realized with a low outlay on circuitry.

With the foregoing and other objects in view, there is provided, in accordance with the invention, a switching device for switching at a high operating voltage, including an LV switching element having an LV cathode terminal, an LV anode terminal, and an LV grid terminal, a first HV switching element having a first HV cathode terminal, a first HV anode terminal, and a first HV grid terminal, the LV anode terminal being electrically short-circuited with the first HV cathode terminal, the LV cathode terminal being electrically short-circuited with the first HV grid terminal, a second HV switching element having a second HV cathode terminal, a second HV anode terminal, and a second HV grid terminal, the a second HV switching element being connected in series with the first HV switching element, and a first protection element being connected between the first and second HV grid terminals.

The switching device referred to in the introduction is characterized by at least in addition a second HV switching element having a second HV cathode terminal, a second HV anode terminal, and a second HV grid terminal, the second HV switching element being connected in series with the first HV switching element, and a first protection element being connected between the first and second HV grid terminals.

The invention is based on the insight that the reverse voltage strength of a cascode circuit including an LV switching element and a first HV switching element can be increased in a simple manner and also in a scalable manner by providing one further HV switching element or else a plurality of further HV switching elements in series with the cascode circuit, i.e., in series with the first HV switching element. In the case of only one further HV switching element, the first protection element connected between the grid terminals of the two HV switching elements has the effect that the further LV switching element that is, otherwise, necessary for the interconnection of the further HV switching element in the case of a series connection of a further cascode element is required just as little as a separate drive for the further LV switching element. Rather, the interconnection with the protection element brings about an automatic driving effect. This is because the further HV switching element also undergoes transition to the blocking state as soon as the first HV switching element is made to assume its blocking state through the externally driven LV switching element. In such a case, the protection element is connected between the two HV grid terminals, in particular, such that it has a conducting-state behavior in the direction from the first to the second HV grid terminal and a blocking behavior in the opposite direction.

Through the fundamental possibility of connecting arbitrary further HV switching elements in series, it is, thus, possible to realize, by way of the number of HV switching elements connected in series, a switching device that is suitable for switching at a high operating voltage and that, in particular, also has a high reverse voltage. In such a case, a high voltage is understood to mean, in particular, a voltage of more than 1,000 V, preferably, of more than 3.5 kV. Furthermore, the required outlay on circuitry is also significantly reduced compared with a series connection of individual cascode elements including the drive circuits thereof because, firstly, no further LV switching elements and, secondly, no further external drives are required. The space requirement for the switching device is, thus, reduced as well.

In accordance with another feature of the invention, besides a second HV switching element, a third HV switching element is additionally connected in series with the first two HV switching elements. As a result, the maximum permissible reverse voltage that can be achieved overall can be increased further. The third HV switching element has a third HV cathode terminal, a third HV anode terminal, and a third HV grid terminal. It is particularly advantageous if an additional, i.e., a second, protection element is also provided in association with the further interconnection with the third HV switching element. The second protection element is, then, connected between the third HV grid terminal and one of the other two HV grid terminals. Both the circuit variant with a connection to the first HV grid terminal and that with a connection to the second HV grid terminal are possible here. By the second protection element, the advantageous driving effect is, likewise, extended to the third HV switching element so that the third HV switching element also changes over to its blocking state as' soon as the second switching element has reached the maximum reverse voltage that is prescribed in association with this embodiment of the switching device. Further HV switching elements and protection elements can be added to the switching device in an analogous manner to achieve a higher maximum permissible reverse voltage.

In accordance with a further feature of the invention, the first and second protection elements have current-blocking behaviors at a voltage present in a reverse direction across the first and second protection elements up to a respective protection element breakdown voltage and current-carrying behavior at a voltage value above the protection element breakdown voltage. In a favorable embodiment, the protection element has a breakdown behavior in the reverse direction starting from a specific voltage present at the protection element. Starting from this so-called protection element breakdown voltage, the current is no longer blocked, rather, a current flow also arises in the reverse direction through the protection element. The breakdown behavior is advantageous, in particular, because it is precisely the reverse current that flows starting from the protection element breakdown voltage that causes the second or else the third HV switching element to switch over from the conducting state to the blocking state. A particularly simple embodiment of the protection element is produced in the form of a diode. The use of a simple pn diode made of silicon is possible in this case. In particular, an avalanche diode made of silicon has the advantageous breakdown behavior described. Such avalanche diodes can be obtained for various protection element breakdown voltages.

Preference is given to a further variant in which an overvoltage protection element is connected between the second HV cathode terminal and the second HV grid terminal. A safeguard against overvoltage is, thereby, achieved at the second HV switching element. Analogously, a corresponding overvoltage protection element may also be provided, of course, at every further HV switching element that is additionally present. A particularly favorable form of realization for the overvoltage protection element is a zener diode.

In accordance with an added feature of the invention, preferably, at least one of the HV switching elements used is realized based upon the semiconductor material silicon carbide (SiC). On account of the high breakdown field strength of SiC, very high reverse voltages can be achieved with this semiconductor material. In such a case, silicon carbide in one of its various polytype embodiments, in particular as 3C-, 4H6H- and 15R-SiC, may be used as the starting material.

In accordance with an additional feature of the invention, there is provided an HV switching element configured as a normally on field-effect transistor. The current flowing through the switching device can, thereby, be controlled very simply and rapidly. Very short switching times and low dynamic losses are possible on account of the unipolar property of a field-effect transistor. A particularly favorable embodiment is the normally on junction field-effect transistor (JFET). A JFET structure that is suitable in this context is described in U.S. Pat. No. 6,034,385 to Stephani et al. or in German Patent DE 198 33 214 C1, corresponding to U.S. Patent Publication 2002/0020849 A1 to Mitlehner et al. In principle, however, other structures are also conceivable for the junction field-effect transistor.

In accordance with yet another feature of the invention, the protection element breakdown voltage is chosen such that the HV switching elements for the protection of which the protection elements are provided are reliably protected against a breakdown. To that end, the protection element breakdown voltage is in each case dimensioned such that it is less than the sum of all the switching element breakdown voltages of those switching elements with which the respective protection element is connected in parallel. In such a case, it must be taken into consideration that the protection element is connected in parallel not only with the HV switching elements but also with the LV switching element of the cascode circuit. Consequently, its albeit very low breakdown voltage must also be taken into account in this dimensioning specification for the protection element breakdown voltage.

In accordance with a concomitant feature of the invention, the first, second, and third HV switching elements are normally on field-effect transistors, at least one of the first, second, and third HV switching elements and the LV switching element each respectively have switching element breakdown voltages, the first, second, and third HV switching elements each respectively have a pinch-off voltage, and a respective one of the protection element breakdown voltages is less than a difference between a sum of the switching element breakdown voltages of at least one of the LV switching element, the first HV switching element, and the second HV switching element with which a respective one of the first and second protection elements is connected in parallel and a respective pinch-off voltage of the second and third HV switching elements to whose HV grid terminal at least one of the first and second protection elements is connected and that is not connected in parallel with the respective one of the first and second protection elements.

An even more effective protection against breakdown is achieved for the HV switching elements protected by the protection element, in a further embodiment, by the so-called pinch-off voltage of the normally on field-effect transistor also being concomitantly taken into account in the dimensioning specification for the protection element breakdown voltage in the case of an HV switching element configured as a normally on field-effect transistor. The pinch-off voltage specifies the voltage value of a voltage that is present between the HV cathode terminal and the HV grid terminal of the normally on field-effect transistor and starting from which a current flow in the normally on field-effect transistor between the HV cathode terminal and the HV anode terminal is reliably prevented. In such a case, it is necessary to take account of the pinch-off voltage of that normally on field-effect transistor to whose HV grid terminal the protection element is indeed connected, but whose drift zone between HV cathode terminal and HV anode terminal is not connected in parallel with the protection element and that, therefore, is also not covered by the protective effect of the protection element.

Thus, the protection element breakdown voltage is to be dimensioned such that it is less than the sum of the switching element breakdown voltages of those switching elements with which the protection element is connected in parallel, the sum being reduced by the pinch-off voltage.

Other features that are considered as characteristic for the invention are set forth in the appended claims.

Although the invention is illustrated and described herein as embodied in a switching device for switching at a high operating voltage, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures of the drawings, unless stated otherwise, identical reference symbols denote identical parts.

Figure 1:
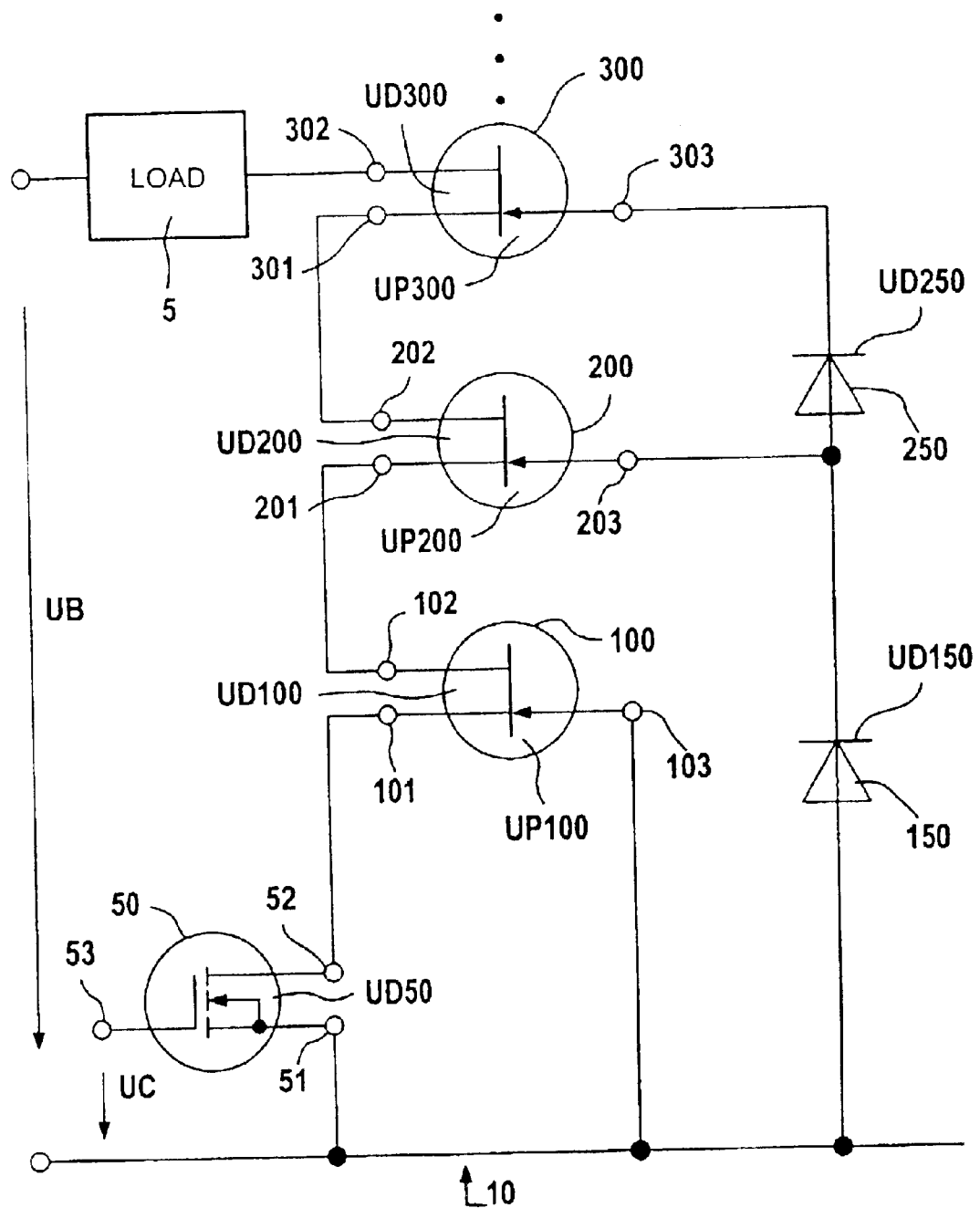
FIG. 1 is a schematic and block circuit diagram of a first embodiment of a switching devices according to the invention suitable for operation at a high voltage.

Referring now to the figures of the drawings in detail and first, particularly to FIG. 1 thereof, there is shown a switching device 10, which is intended for connecting and disconnecting a load 5 to and from a high operating voltage UB. The operating voltage UB is 3,000 V in the exemplary embodiment shown. An example of an appropriate load is a converter branch used in a variable-speed drive.

The switching device 10 includes a low-voltage (LV) switching element in the form of a normally off MOSFET 50 and also a total of three high-voltage (HV) switching elements each in the form of a normally on junction field-effect transistor (JFET) 100, 200, 300 and also two protection elements each in the form of an avalanche diode 150, 250 realized in silicon.

The three HV switching elements 100, 200, and 300 in each case have an HV cathode terminal 101, 201, 301, an HV anode terminal 102, 202, 302 and an HV grid terminal 103, 203, 303. The MOSFET 50 has an LV cathode terminal 51, an LV anode terminal 52 and also an LV grid terminal 53. The HV grid terminal 53 is intended for operation from a control voltage UC by which the switching device 10 can be switched over between conducting and blocking states.

In the blocking, i.e., switched-off, state, the three JFETs 100, 200, 300 take up the operating voltage UB. Depending on the configuration, the operating voltage UB is divided between the three JFETs 100, 200, 300. In the present case, the operating voltage UB is divided substantially uniformly between the three JFETs 100, 200, 300. In a different non-illustrated embodiment, however, a voltage distribution that deviates from uniform distribution is possible.

The MOSFET 50 and the JFET 100 are connected together in a so-called cascode circuit. For such a purpose, the LV anode terminal 52 is electrically short-circuited with the HV cathode terminal 101 and the LV cathode terminal 51 is electrically short-circuited with the HV grid terminal 103. U.S. Pat. No. 6,157,049 to Mitlehner et al. and European Patent Application 0 063 749 B1, corresponding to U.S. Pat. No. 4,663,547 to Baliga et al., describe such a cascode circuit as well as its method of operation.

In the exemplary embodiment of FIG. 1, the MOSFET 50 is realized in silicon (Si) and the JFET 100, as well as the other two JFETs 200, 300, are realized in silicon carbide (SiC). As a result, the high switching speed that can be achieved in silicon for initiating the switch-on/off and, moreover, the high breakdown voltage that can be achieved in silicon carbide are exploited.

In contrast to the JFET 100, which is interconnected through the cascode interconnection with the LV MOSFET 50 for switch-on and switch-off, no additional interconnection with an LV switching element that initiates the switch-on/off through an external control voltage is provided for the other two HV switching elements 200 and 300. This means, on one hand, that the outlay on circuitry is reduced, and, on the other hand, it is necessary to ensure that the JFETs 200 and 300 are switched on/off at the right time in a different way.

For this reason, the avalanche diodes 150, 250 are connected between the HV grid terminals 103 and 203 and, respectively, between the HV grid terminals 203 and 303. The avalanche diodes 150 and 250 protect the JFET 100 and 200 respectively connected in parallel therewith against a breakdown. For such a purpose, the avalanche diode 150 causes the JFET 200 to assume the blocking state, and the avalanche diode 250 causes the JFET 300 to assume the blocking state, at the right time such that the JFETs 100 and 200 are not driven into breakdown.

This circuit behavior will be explained in more detail below. The MOSFET 50 is configured for a switching element breakdown voltage UD50 of at least 50 V, for example. By contrast, the JFETs 100, 200, and 300 are each configured for a reverse-biased switching element breakdown voltage UD100, UD200, and UD300, respectively, of at least 1,000 V, for example.

Moreover, the three JFETs 100, 200, and 300 in each case have a pinch-off voltage UP100, UP200, and UP300, respectively, of about 50 V. If the HV cathode terminal 101 is biased negatively by the value of the pinch-off voltage UP100, that is to say, by 50 V, with respect to the HV grid terminal 103 of the JFET 100, then a complete pinch-off of the current flow channel between the HV cathode terminal 101 and the HV anode terminal 102 occurs in the JFET 100. The JFET 100, then, turns off. The pinch-off and the turn-off of the other two JFETs 200 and 300 take place in an analogous manner.

If the MOSFET 50 is caused to assume the blocking state by a corresponding value of the control voltage UC, the JFET 100 also undergoes transition to its blocking state on account of the method of operation of the cascode circuit. This means that an increasing potential up to about 1,000 V builds up at the HV anode terminal 102, but the potential still lies below the maximum permissible switching element breakdown voltage UD100. This is because shortly before the voltage at the JFET 100 exceeds the breakdown voltage UD100, the JFET 200 also switches over to its blocking state, given corresponding dimensioning of the avalanche diode 150. This is achieved precisely when the avalanche diode 150 has, in its reverse direction, a breakdown behavior that commences from a protection element breakdown voltage UD150. In such a case, the protection element breakdown voltage UD150 is less than the potential at the HV anode terminal 102 reduced by the pinch-off voltage UP200. The following dimensioning specification, thus, holds true:

$$UD150 < (UD50 + UD100) - UP200 \qquad (1)$$

If the dimensioning specification of equation (1) is satisfied, the JFET 200 reliably switches to its blocking state before an undesirable breakdown that damages the respective component can occur at the MOSFET 50 or at the JFET 100. In the present case, the avalanche diode 150 has a protection element breakdown voltage UD150 of about 950 V.

For the avalanche diode 250, too, a corresponding dimensioning specification can be derived in a similar manner. The avalanche diode 250 is substantially connected in parallel with the JFET 200 and is intended to protect the JFET 200 against a breakdown. Thus, a condition here is that the JFET 300 is transferred to its blocking state actually before the voltage present between the HV cathode terminal 201 and the HV anode terminal 202 becomes greater than the maximum permissible breakdown voltage UD200. The pinch-off voltage UP300, which is necessary for a reliable pinch-off of the JFET 300 between the HV cathode terminal 301 and the HV grid terminal 303, enters into this second dimensioning specification. Consequently, the following dimensioning specification results for the avalanche diode 250:

$$UD250 < UD200 - UP300 \qquad (2)$$

For the avalanche diode 250, too, a protection element breakdown voltage UD250 of about 950 V is provided in the exemplary embodiment of FIG. 1.

The specified voltage values of the individual components of FIG. 1 are to be understood only as examples. Thus, a different non-illustrated embodiment with an operating voltage UB of 10 kV and breakdown voltages UD100, UD200, and UD300 of about 3.33 kV in each case is possible. Moreover, it is, likewise, possible without difficulty, as required, to supplement further HV switching elements in the form of further JFETs and also further protection elements in the form of further avalanche diodes in an analogous manner. This may be expedient, for example, when a higher operating voltage UB is present or the JFETs 100, 200, and 300 have a switching element breakdown voltage that is lower than the switching element breakdown voltages UD100, UD200, and UD300, respectively, specified above.

Figure 2:
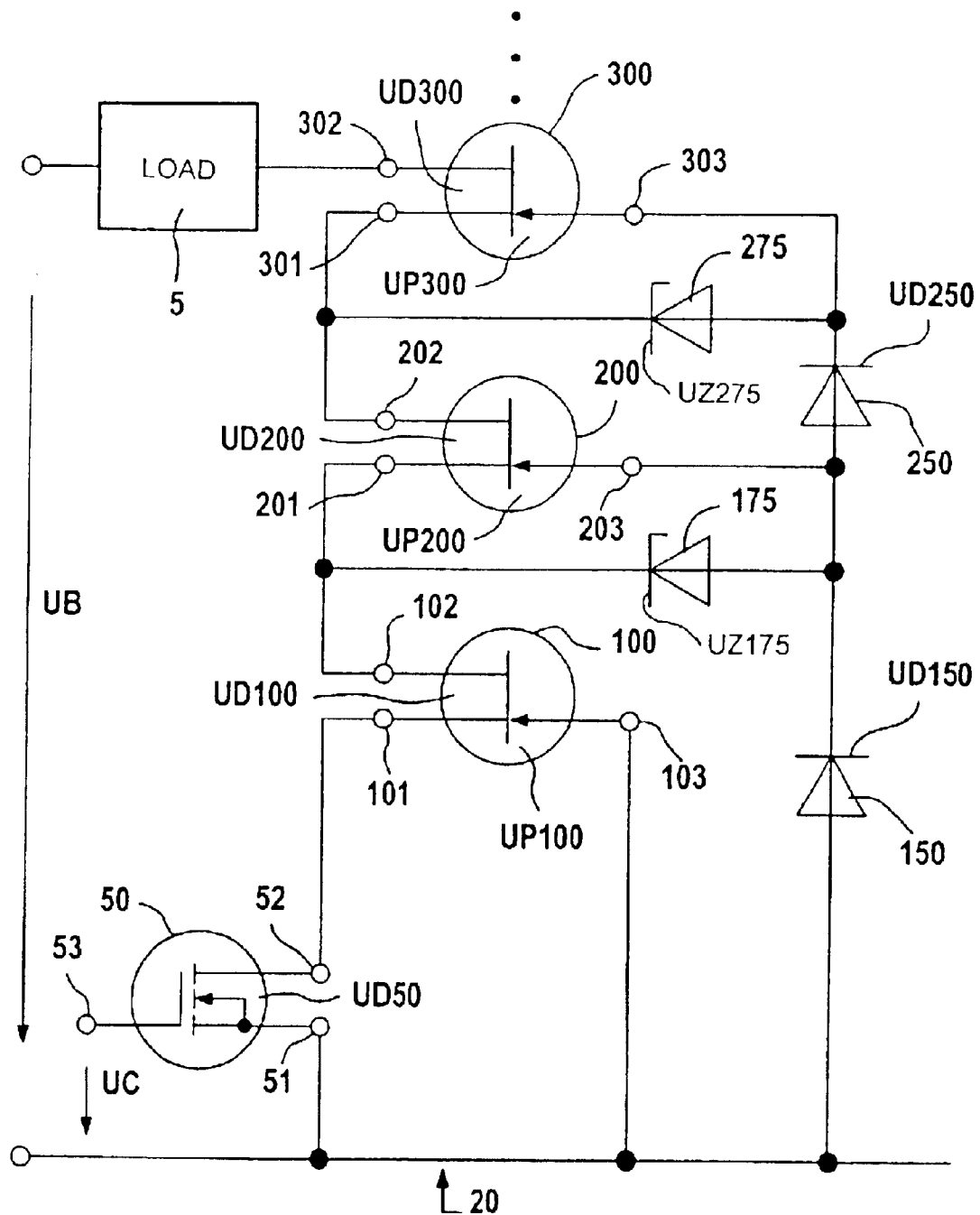
FIG. 2 is a schematic and block circuit diagram of a second embodiment of a switching devices according to the invention suitable for operation at a high voltage.

FIG. 2 illustrates a further switching device 20, which is substantially based on the basic variant of the switching device 10 of FIG. 1. The difference from switching device 10 is that the switching device 20 of FIG. 2 has additional overvoltage protection elements in the form of two zener diodes 175 and 275. The zener diodes 175 and 275 are commercially available silicon components that can be obtained with a zener voltage UZ175 and UZ275, respectively, that can be chosen within certain limits.

The zener diodes 175 and 275 are connected between the HV cathode terminal 201 and the HV grid terminal 203 and, respectively, between the HV cathode terminal 301 and the HV grid terminal 302. They serve to afford overvoltage protection for the JFET 200 and the JFET 300, respectively. The zener voltages UZ175 and UZ275 have approximately the same value as the pinch-off voltage UP200 and UP300, respectively, of the JFET 200 and 300, respectively, to be protected by the respective zener diode 175 and 275. Thus, in the present case, a value of the order of magnitude of about 50 V is provided for the zener voltages UZ175 and UZ275.

At a value of the zener voltage UZ175 that is significantly lower than the pinch-off voltage UP200, the case may arise where the current flow channel in the JFET 200 is pinched off only incompletely and the JFET 200, thus, has only a reduced blocking behavior. By contrast, if the zener voltage UZ175 is chosen to be significantly greater than the pinch-off voltage UP200, the protective effect actually intended for the zener diode 175 comes into force only to a restricted extent. This is because, in this case, an internal diode of the JFET 200 between the HV grid terminal 203 and the HV cathode terminal 201 determines the voltage drop across the JFET 200. It is most favorable, therefore, if the value of the zener voltage UZ175 substantially corresponds to the value of the pinch-off voltage UP200.

Figure 3:
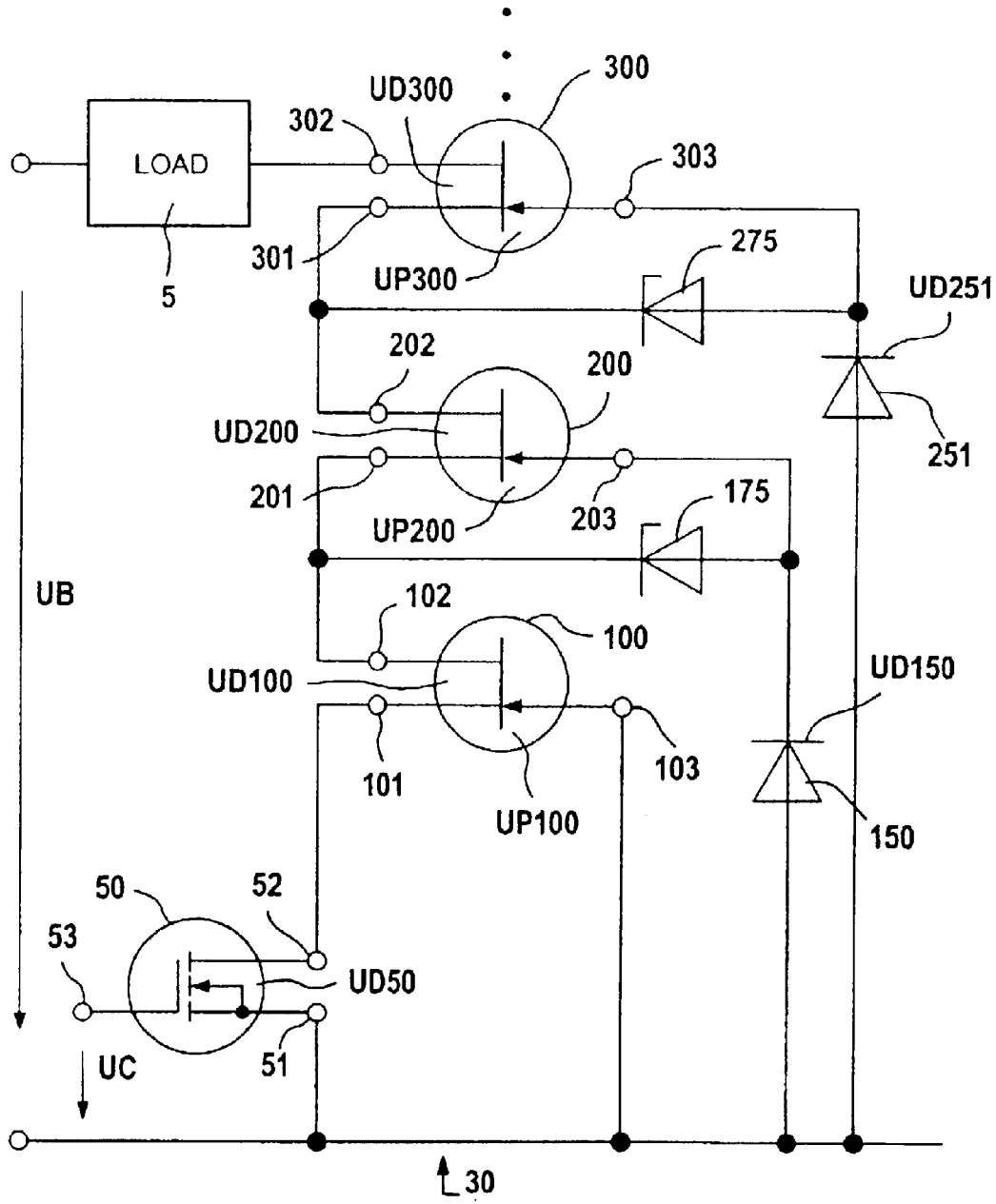
FIG. 3 is a schematic and block circuit diagram of a third embodiment of a switching devices according to the invention suitable for operation at a high voltage.

FIG. 3 shows a further switching device 30, which represents another modification of the basic variant of the switching device 10 of FIG. 1. In contrast to the switching device 10, an avalanche diode 251 connected to the HV grid terminal 303 of the JFET 300 is not connected to the HV grid terminal 203 of the JFET 200, but, rather, to the HV grid terminal 103 of the JFET 100. However, this does not change anything of the fundamental method of operation of the protective interconnection by a protection element in the form of an avalanche diode 150 and 251. To ensure that the JFET 300 switches over to the blocking state at the right time, a protection element breakdown voltage UD251 of the avalanche diode 251 is chosen in accordance with the following specification:

$$UD251 < (UD50 + UD100 + UD200) - UP300 \qquad (3)$$

Consequently, in the exemplary embodiment of FIG. 3, a value of 2,000 V is provided for the protection element breakdown voltage UD251. In contrast to the exemplary embodiment of FIG. 1, the avalanche diode 251 is connected in parallel not only with the JFET 200, but also with the JFET 100 and the MOSFET 50. Therefore, the corresponding switching element breakdown voltages UD50 and UD100 of these switching elements 50 and 100, respectively, also enter into equation (3). Despite this slightly modified dimensioning specification for the avalanche diode 251, however, the circuit device 30, in principle, exhibits the same operating behavior as the switching device 20 or the switching device 10.

The cascading of a plurality of high-voltage JFETs with a cascode circuit including a low-voltage MOSFET and a high-voltage JFET that is shown in FIGS. 1 to 3 makes it possible to realize, in a simple manner and with a low outlay on circuitry, a switching device that can be operated at a high voltage and that, in particular, can also be adapted to a predetermined high operating voltage in a very simple manner by supplementarily connecting further cascade elements (=high-voltage JFETS). Moreover, on account of the use of unipolar switching elements (MOSFET, JFET), the switching devices 10, 20, and 30 described have a very short response time and are, therefore, suitable for use at a high switching more, the use of the unipolar components very low dynamic losses.

We claim:

1. A switching device for switching at a high operating voltage, comprising:
   an LV switching element having an LV cathode terminal, an LV anode terminal, and an LV grid terminal;
   a first HV switching element having a first HV cathode terminal, a first HV anode terminal, and a first HV grid terminal, said LV anode terminal being electrically short-circuited with said first HV cathode terminal, said LV cathode terminal being electrically short-circuited with said first HV grid terminal;
   a second HV switching element having a second HV cathode terminal, a second HV anode terminal, and a second HV grid terminal, said a second HV switching element being connected in series with said first HV switching element; and
   a first protection element being connected between said first and second HV grid terminals.

2. The switching device according to claim 1, further comprising a third HV switching element having a third HV cathode terminal, a third HV anode terminal, and a third HV grid terminal, said third HV switching element being connected in series with said first HV switching element and said second HV switching element.

3. The switching device according to claim 2, further comprising a second protection element connected between said third HV grid terminal and one of said first and second HV grid terminals.

4. The switching device according to claim 3, wherein said first and second protection elements have current-blocking behaviors at a voltage present in a reverse direction across said first and second protection elements up to a respective protection element breakdown voltage and current-carrying behavior at a voltage value above said protection element breakdown voltage.

5. The method according to claim 1, wherein said first protection element is a diode.

6. The method according to claim 1, wherein said first protection element is an avalanche diode.

7. The method according to claim 4, wherein at least one of said first and second protection elements is a diode.

8. The method according to claim 4, wherein at least one of said first and second protection elements is an avalanche diode.

9. The switching device according to claim 1, further comprising an overvoltage protection element connected between said second HV cathode terminal and said second HV grid terminal.

10. The switching device according to claim 9, wherein said overvoltage protection element is a zener diode.

11. The switching device according to claim 1, wherein at least one of said first and second HV switching elements is formed of silicon carbide.

12. The switching device according to claim 2, wherein at least one of said first, second, and third HV switching elements is formed of silicon carbide.

13. The switching device according to claim 1, wherein at least one of said first and second HV switching elements is a normally on field-effect transistor.

14. The switching device according to claim 1, wherein at least one of said first and second HV switching elements is a normally on junction field-effect transistor.

15. The switching device according to claim 2, wherein at least one of said first, second, and third HV switching elements is a normally on field-effect transistor.

16. The switching device according to claim 2, wherein at least one of said first, second, and third HV switching elements is a normally on junction field-effect transistor.

17. The switching device according to claim 4, wherein:
   at least one of said first, second, and third HV switching elements and said LV switching element respectively have switching element breakdown voltages; and
   said protection element breakdown voltages are less than a sum of said switching element breakdown voltages of ones of said first, second, and third HV switching elements and said LV switching element with which a respective one of said first and second protection elements is connected in parallel.

18. The switching device according to claim 4, wherein:

said first, second, and third HV switching elements are normally on field-effect transistors;

at least one of said first, second, and third HV switching elements and said LV switching element respectively have switching element breakdown voltages;

said first, second, and third HV switching elements each respectively have pinch-off voltages; and a respective one of said protection element breakdown voltages is less than a difference between a sum of said switching element breakdown voltages of at least one of said LV switching element, said first HV switching element, and said second HV switching element with which a respective one of said first and second protection elements is connected in parallel and a respective pinch-off voltage of said second and third HV switching elements to whose HV grid terminal said respective one of said first and second protection elements is connected and that is not connected in parallel with said respective one of said first and second protection elements.

19. The switching device according to claim 18, wherein said first, second, and third HV switching elements are normally on junction field-effect transistors.

20. The switching device according to claim 1, wherein said first protection element has a current-blocking behavior at a voltage present in a reverse direction across said first protection element up to a protection element breakdown voltage and current-carrying behavior at a voltage value above said protection element breakdown voltage.

* * * * *